United States Patent [19]
Kawada et al.

[11] Patent Number: 5,386,436
[45] Date of Patent: Jan. 31, 1995

[54] SYNCHRONIZATION SYSTEM FOR USE IN DIGITAL TRANSMISSION SYSTEM

[75] Inventors: Shinichi Kawada; Keiichiro Hijino, both of Tokyo; Hiroshi Wada, Saitama; Masahisa Iida, Kanagawa, all of Japan

[73] Assignees: Oki Electric Industry Co., Ltd.; Kokusai Denshin Denwa Co., Ltd., both of Tokyo, Japan

[21] Appl. No.: 879,819

[22] Filed: May 7, 1992

[30] Foreign Application Priority Data

May 10, 1991 [JP] Japan .................................. 3-105553

[51] Int. Cl.⁶ .................................................. H04L 7/00
[52] U.S. Cl. ............................................ 375/106; 375/27; 375/122; 370/100.1; 341/143; 348/410
[58] Field of Search .................... 375/25, 27, 106, 122; 341/51, 76, 143; 370/100.1, 7-9; 381/29, 31; 348/404-405, 410

[56] References Cited

U.S. PATENT DOCUMENTS

| 4,578,800 | 3/1986 | Yasuda et al. | 375/106 |
| 4,592,070 | 5/1986 | Chow et al. | 375/27 |
| 4,860,313 | 8/1989 | Shpiro | 375/27 |

OTHER PUBLICATIONS

CCITT Recommendations G. 721 and G. 722.

*Primary Examiner*—Stephen Chin
*Assistant Examiner*—Young Tse
*Attorney, Agent, or Firm*—Edward D. Manzo; Ted K. Ringsred

[57] ABSTRACT

In a synchronization system for use in a digital transmission system in which an encoded digital transmission signal at least part of bits of which have specific statistic characteristics is transmitted, a digital transmission signal received by a decoder within a digital transmission apparatus at a receiving end is subjected to a decoding processing in units of samples on the basis of a synchronous input signal. The digital transmission apparatus at the receiving end includes a monitor for monitoring internal states of the decoder which vary between a synchronous state and an asynchronous state owing to the statistic characteristics of the digital transmission signal, a synchronization detector for determining whether the digital transmission system is in the synchronous state based on an output of the monitor, and a phase shifter for shifting a relative phase of the digital transmission signal against a synchronous input signal supplied to the decoder, one bit by one on the digital transmission signal in units of samples, in the case that a determination result of the synchronization detector indicates the asynchronous state.

10 Claims, 5 Drawing Sheets

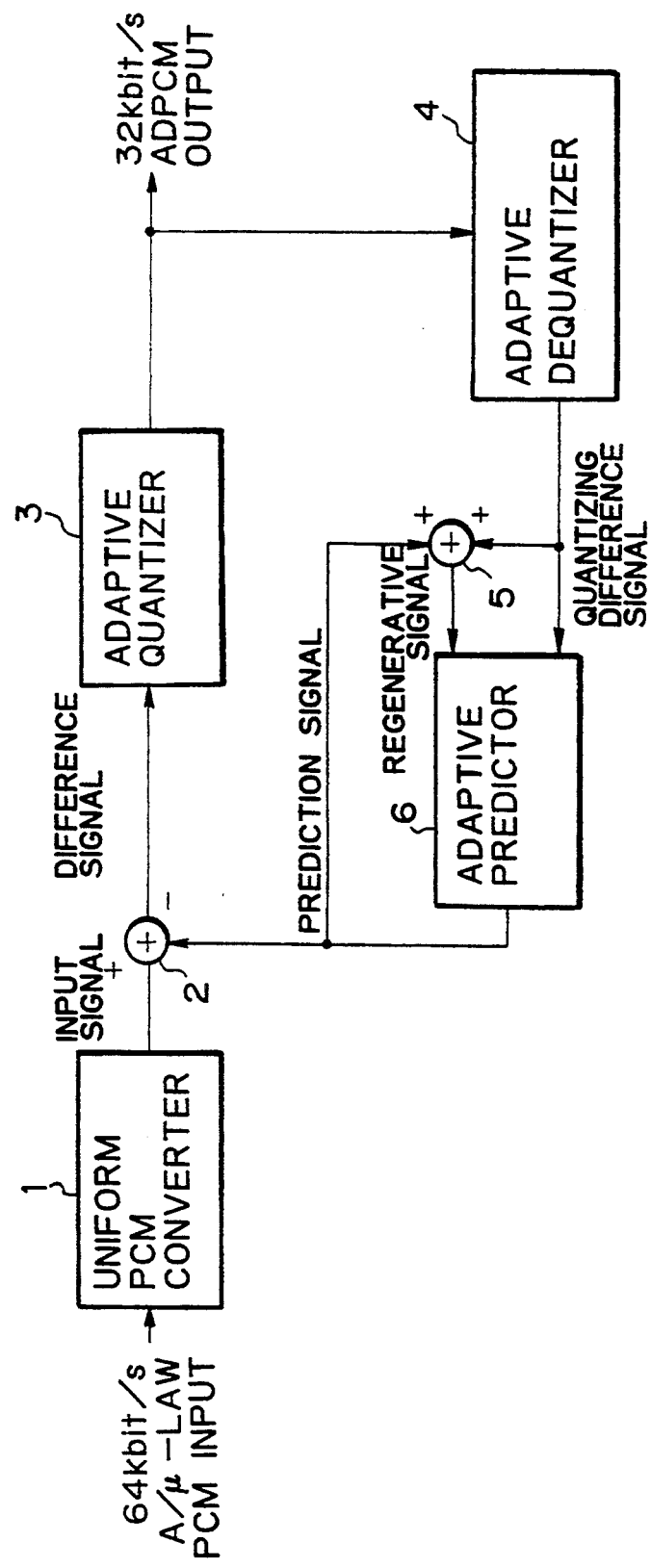

SYNCHRONIZATION SYSTEM FOR USE IN DIGITAL TRANSMISSION SYSTEM

BACKGROUND OF THE INVENTION

1. Field of the Invention

The present invention relates to a synchronization system for use in a digital transmission system in which an analog signal such as voice signal is converted into a digital signal and then transmitted.

2. Description of the Prior Art

As the digital transmission system in which an analog signal such as voice signal is converted into a digital signal and then transmitted, hitherto there is generally used a system in which the analog signal is converted into a 64 K bit/sec of PCM signal and then transmitted.

There have also been developed various types of high efficiency encoding schemes which are contemplated to transmit the voice and the like at lower bit rate. According to the CCITT (International Telegraph and Telephone Consultative Committee), ADPCM (Adaptive Differential PCM) scheme, in which an analog signal having 3.4 kHz of bandwidth is compressed to 32 k bit/s, is standardized in Recommendation G. 721, and further SB-ADPCM (Sub-band ADPCM) scheme, in which an analog signal having 7 kHz of band is compressed to 64 k bit/s, is standardized in Recommendation G. 722.

Now, in a case where ADPCM signals are transmitted, including ADPCM signals according to both the Recommendations (under the circumstances, also including SB-ADPCM signals), it is difficult for a decoder to reliably decode, if the decoder cannot discriminate which 4 bits or 8 bits among continuous digital signals or a bit stream are of data constituting one sample. In other words, it is necessary to accurately synchronize the ADPCM signals with synchronous input signals.

Hitherto, as methods of synchronization, there have been employed the following two methods. Now it is noted that for the purpose of an exemplary explanation of the conventional methods of the synchronization, description will be made on the ADPCM signals according to CCITT Recommendation G. 721.

FIG. 3 is a diagram for an explanation of a first method of synchronization. According to the first method of synchronization, information for synchronization such as a frame pattern is inserted into the ADPCM signal which is delivered between an encoder and a decoder. The frame pattern comprises a plurality (m, a natural number) of bits. The encoder distributes the m bits of the frame pattern to the LSB (Least Significant Bit) position of the samples separated from each other with the pitch of n samples, which are in turn transmitted. The decoder determines whether a pattern, which is formed by m bits separated from each other with the pitch of (4×n) bits, coincides with a predetermined frame pattern. The synchronization is established so as to have the received ADPCM signal separated into four bits coinciding with the frame pattern.

FIG. 4 is a diagram for the explanation of a second method of synchronization. According to the second method of synchronization, as shown in part (A) of FIG. 4, the ADPCM signal is transmitted, without any conversion, as it is. In addition, synchronous input signals or frame synchronous signals shown in part (B) of FIG. 4, each being significant during a period of MSB (Most Significant Bit) of the associated sample of the ADPCM signal, are delivered between an encoder and a decoder so that the synchronization can be obtained.

The first method of synchronization mentioned above has such an advantage that there are no signals such as synchronous input signals to be transmitted other than the digital transmission signals or ADPCM signals to be delivered between the encoder and the decoder. It has however such a disadvantage that there occurs deterioration on a decoded signal owing to insertion of the frame pattern into part of the digital transmission signal.

The second method of synchronization mentioned above has such an advantage that the digital transmission signals or ADPCM signals can be reliably transmitted, it has such a disadvantage that the synchronous input signals or frame synchronous signals in addition to the digital transmission signals have to be transmitted.

SUMMARY OF THE INVENTION

It is therefore an object of the present invention, in view of the foregoing problems, to provide a synchronization system for use in a digital transmission system according to which part of the digital transmission signal is not sacrificed for the synchronization, and in addition there is no need to transmit signals for synchronization other than the digital transmission signals.

In a preferred embodiment, a synchronization system for use in a digital transmission system in which an encoded digital transmission signal is transmitted, wherein a digital transmission signal received by a decoder within a digital transmission apparatus at a receiving end is subjected to a decoding processing in units of samples on the basis of a synchronous input signal, only the digital transmission signal is transmitted from a digital transmission apparatus at a transmission end to said digital transmission apparatus at the receiving end, and said digital transmission apparatus at the receiving end comprises: monitor means for monitoring internal states of said decoder which vary between a synchronous state and an asynchronous state owing to the statistic characteristics of the digital transmission signal; synchronization detection means for determining whether the synchronization system is in the synchronous state based on an output of said monitor means; and phase shift means for shifting a relative phase of the digital transmission signal against a synchronous input signal supplied to said decoder one bit by one on the digital transmission signal in units of samples, in the case where a determination result of said synchronization detection means indicates the asynchronous state.

BRIEF DESCRIPTION OF THE DRAWINGS

The objects and features of the present invention will become more apparent from the consideration of the following detailed description taken in conjunction with the accompanying drawings in which:

FIGS. 2A and 2B are block diagrams showing structures of an ADPCM encoder and decoder according to CCITT Recommendation G. 721, respectively;

DESCRIPTION OF THE PREFERRED EMBODIMENTS

Figure 1:
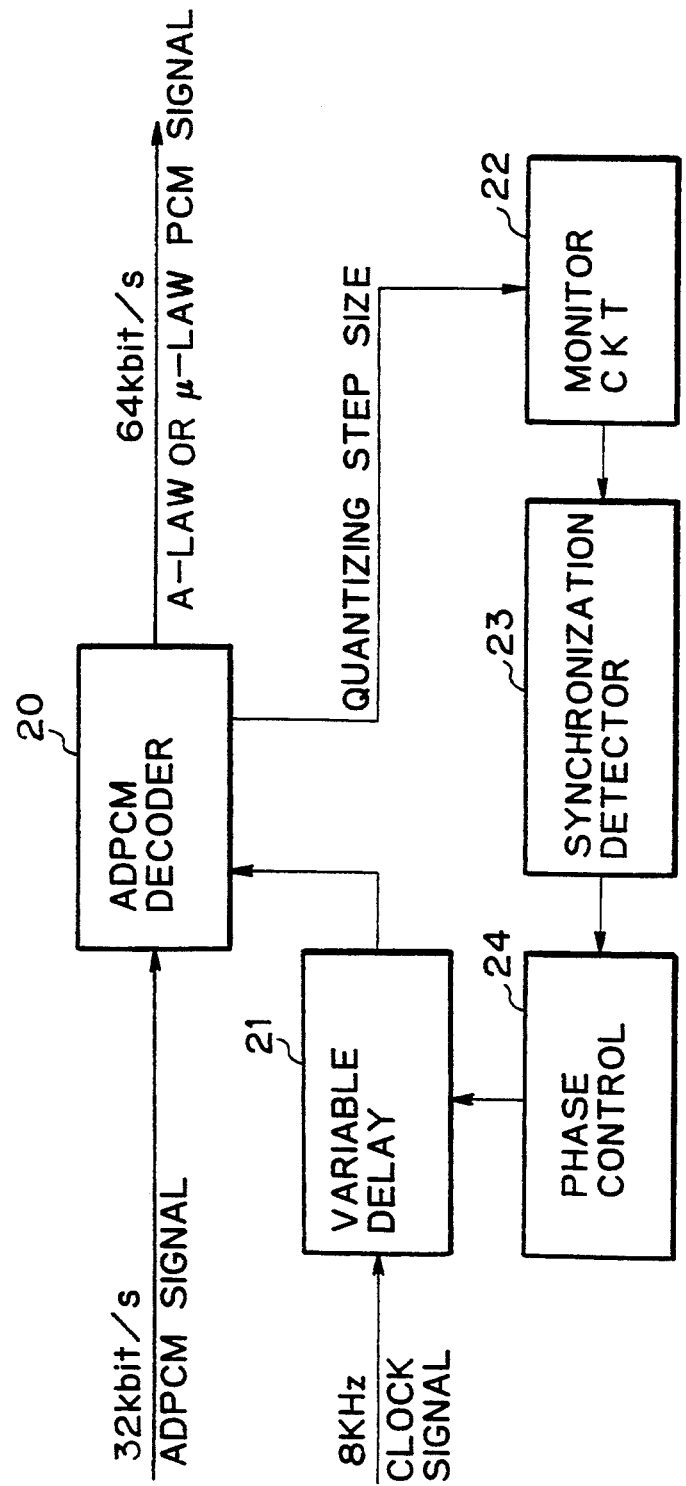
FIG. 1 is a block diagram schematically showing an illustrative embodiment of a digital transmission apparatus at a sink or a receiver end according to the present invention.

An illustrative embodiment, which is applicable to a synchronization system for use in a transmission system of the ADPCM according to CCITT Recommendation G. 721, will be explained hereinafter in conjunction with the accompanying drawings.

Before giving a detailed explanation of the illustrative embodiment according to the present invention, an ADPCM encoder and decoder according to CCITT Recommendation G. 721 will be explained hereinafter for the sake of better understanding of the present invention. Referring to FIG. 2A, the ADPCM encoder, which is provided in a digital transmission apparatus at a transmission end, receives a 64 k bit/sec non linear PCM signal with a sampling frequency of 8 kHz, for example, a μ-law PCM signal, generally used in United States and Japan, or an A-law PCM signal, generally used in Europe. A uniform PCM converter 1 converts such a non linear PCM signal to a uniform PCM signal or a linear PCM signal, and then supplies the same to a difference computing unit 2. The difference computing unit or circuit 2 serves to obtain a difference signal or a prediction error signal between the uniform PCM signal converted in the uniform PCM converter 1 and a prediction signal for the uniform PCM signal, and supplies the thus obtained difference signal to an adaptive quantizer 3. The adaptive quantizer 3 quantizes the difference signal on a 4-bit basis. The size of quantizing steps may be adaptively varied in accordance with the magnitude of the difference signal. Thus, in the case of a larger difference signal, the larger size of quantizing step is used, and on the other hand, in the case of a smaller difference signal, the reduced size of quantizing step is used. This makes it possible to quantize the difference signal covering a wide range with fewer bits, such as 4 bits. The ADPCM signal, quantized on a 4-bit basis with the bit rate of 32 k bit/s, which is equal to 4 bits multiplied by the sampling frequency of 8 kHz, is produced from the encoder.

Further, the ADPCM signal quantized on a 4-bit basis is supplied to an adaptive dequantizer 4. The adaptive dequantizer 4 performs the reverse processing made in the adaptive quantizer 3 to obtain a quantizing difference signal for a local regeneration, and supplies the thus obtained quantized difference signal to an adder 5 and an adaptive predictor 6. The adder 5 adds the quantizing difference signal and the prediction signal to obtain a local regenerative signal, and supplies the same to the adaptive predictor 6. The adaptive predictor 6 obtains a prediction coefficient based on the past quantizing difference signal or a prediction error signal and the local regenerative signal, then obtains a present prediction signal applying the present quantizing difference signal and the local regenerative signal to the obtained prediction coefficient, and supplies the thus obtained present prediction signal to the difference computing unit 2 and the adder 5. In other words, the adaptive predictor 6 functions as adaptively updating the prediction coefficient in accordance with the past quantizing difference signal and the local regenerative signal.

As mentioned above, an application of the adaptive quantization and the adaptive prediction makes it possible to compress an analog signal having 3.4 kHz of bandwidth to 32 k bit/s and output the same.

Figure 2B:
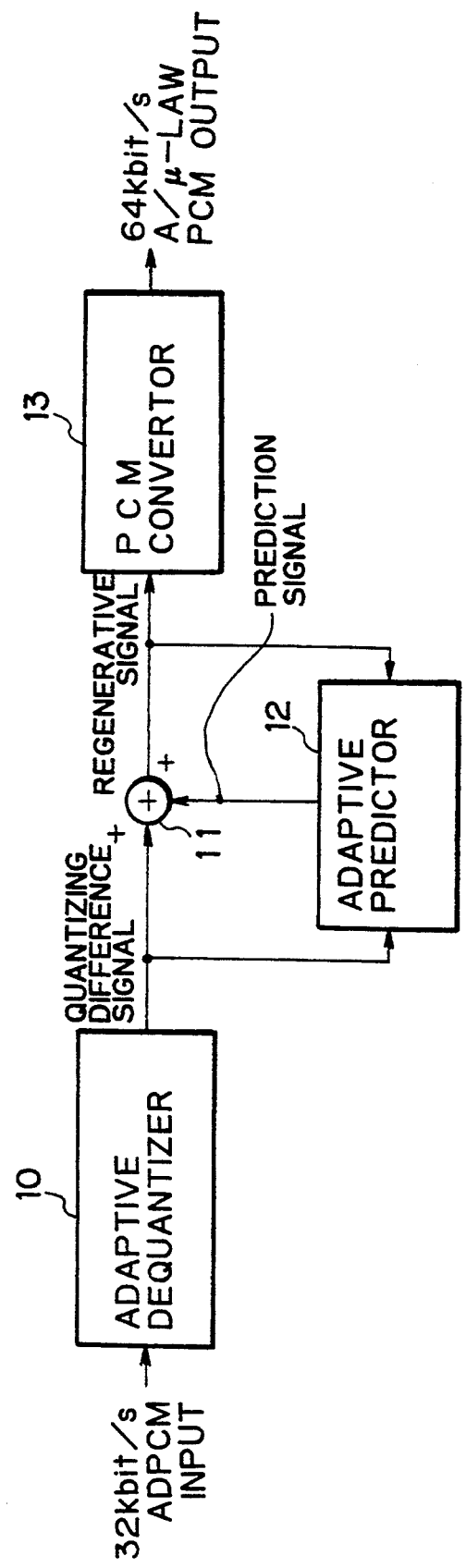
Figure 3:
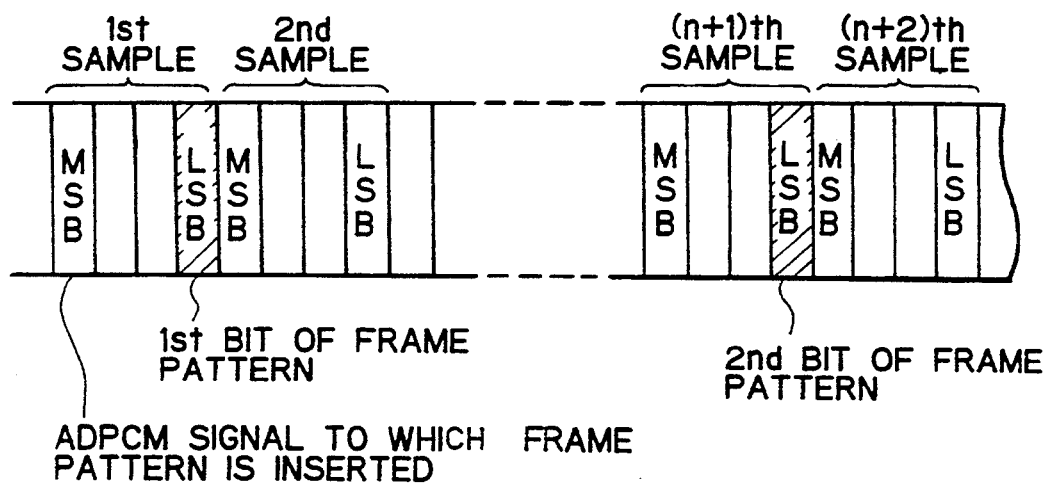
FIG. 3 is a diagram for the explanation of the conventional, first synchronization scheme.
Figure 4:
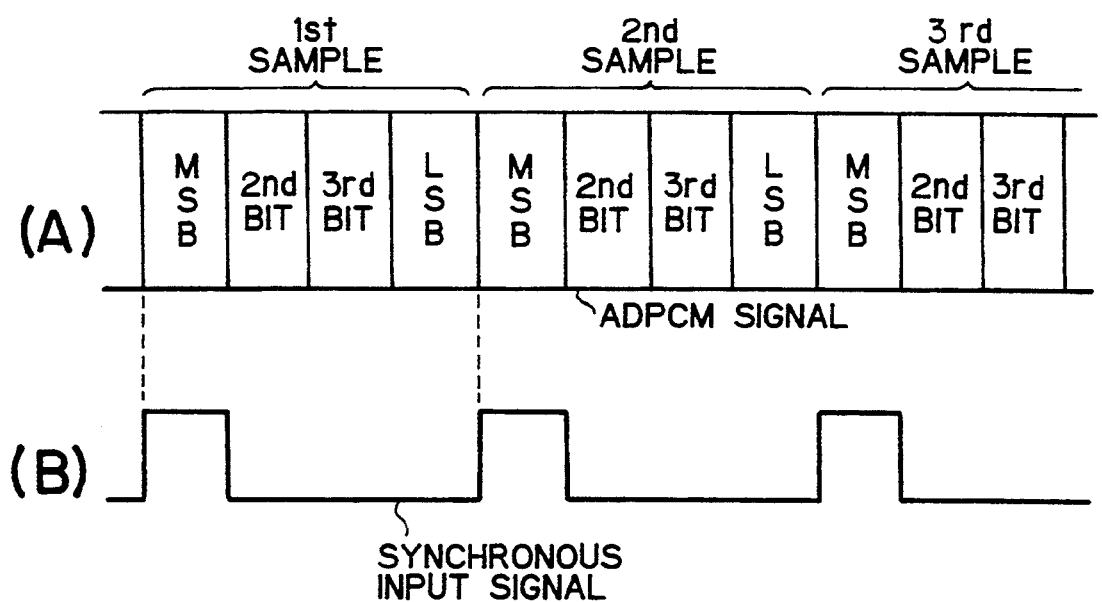
FIGS. 4A and 4B are a diagram for the explanation of the conventional second synchronization scheme.

Next, the ADPCM decoder corresponding to the above mentioned ADPCM encoder, which is provided in a digital transmission apparatus at a receiver end, will be explained referring to FIG. 2B. In FIG. 2B, a 32 k bit/s ADPCM signal is applied to an adaptive dequantizer 10. The adaptive dequantizer 10 performs the reverse processing of the adaptive quantizer 3 to obtain a quantizing difference signal for a regeneration, and supplies the thus obtained quantizing difference signal to an adder 11 and an adaptive predictor 12. The adder 11 adds the quantizing difference signal and a prediction signal supplied from the adaptive predictor 12 to obtain a regenerative signal, and supplies the same to the adaptive predictor 12 and a PCM conversion unit 13. The adaptive predictor 12 obtains a prediction coefficient based on the past quantizing difference signal or a prediction error signal and the regenerative signal, then obtains a present prediction signal applying the present quantizing difference signal and the regenerative signal to the obtained prediction coefficient, and supplies the thus obtained present prediction signal to the adder 11.

The PCM conversion unit 13 converts the regenerative signal or uniform PCM signal from the adder 11 to a 64 k bit/s A-law PCM signal or μ-law PCM signal or non linear PCM signal, and outputs the thus converted signal to the next stage.

Now, it is noted that while not illustrated, a synchronous input signal is applied to the ADPCM decoder, and the ADPCM decoder serves to separate the ADPCM signal into samples each consisting of 4 bits so as to perform the decoding processing.

While the ADPCM encoder and decoder according to CCITT Recommendation G. 721 have been explained above, the SB-ADPCM encoder and decoder according to CCITT Recommendation G. 722 is the same as the ADPCM encoder and decoder mentioned above in processing principle except that a band is divided for processing. More specifically, according to the SB-ADPCM encoder and decoder, a band, extending to 7 kHz, of an input analog signal is divided into a lower frequency band 0–4 kHz and a higher frequency band 4–7 kHz taking 4 kHz as border, and the ADPCM encoding and decoding processes mentioned above are applied to the respective bands.

Now it is noted that the SB-ADPCM scheme according to CCITT Recommendation G. 722 is naturally different from the ADPCM scheme according to CCITT Recommendation G. 721 in the points that it is necessary for the encoder end to provided an arrangement in which the compressed and encoded ADPCM signals are synthesized, and it is necessary for the decoder end to provided an arrangement in which the synthesized ADPCM signals are divided into higher and lower frequency bands of ADPCM signals.

(A) Statistic Characteristics of ADPCM Signal

An aspect of the present embodiment resides in the point that the utilization of statistic characteristics of the ADPCM signal enables receiving and decoding (synchronization) to be properly carried out in units of samples. Therefore, first, the statistic characteristics of the ADPCM signal will be explained.

The ADPCM signal is, as mentioned above, a signal which is obtained in such a manner that a difference signal between a prediction signal and an actual input signal or uniform PCM signal is quantized with an adaptive quantizing step, and may be expressed usually with a bit length (4 bits per one sample) of the ADPCM signal. The bits of the signals have the following characteristics in statistic.

(A-1) MSB (Most Significant Bit)

The MSB of the ADPCM signal is a polarity (code) bit, and takes logical "0" or "1" to represent the positive or negative sign. While there are numerous reversals between "1" and "0" of the MSB, since it is difficult to perform a prediction in condition such that only noises are inputted to the ADPCM encoder, the logical levels of the MSB are reversed in accordance with a number of polarity reversal times of an error between an input signal and the prediction signal in condition such that the input signals are inputted to the ADPCM encoder.

(A-2) Second Bit

The second bit of the ADPCM signal is a most significant bit among three bits representative of amplitude information. There is the low probability such that a value of the difference signal is large, since the difference signal is given with a difference between the input signal and the prediction signal. Consequently, there is the very high probability that the second bit takes "0". That is, the second bit among the 4 bits related to one sample has the highest probability of being a logic "0".

(A-3) Third Bit

The third bit of the ADPCM signal is the second bit among three bits representative of amplitude information. A number of reversal times or a reversal frequency of the change of the third from "1" to "0", or from "0" to "1" is the average value among 4 bits related to one-sample.

(A-4) LSB (Least Significant Bit)

The LSB of the ADPCM signal is the least significant bit among three bits representative of amplitude information. Thus, this bit is frequently reversed, since "1" and "0" is reversed on the basis of a variation of the minimum level, or the size of quantizing steps, of the difference signal.

(B) Relation of Statistic Characteristics and Asynchronous State

If the ADPCM signal having the statistic characteristics mentioned above is processed by the ADPCM decoder in an asynchronous state, the obtained regenerative signals and the like have the features read as follows.

(B-1) In a Case Where the Original Second Bit Is Regarded as MSB

First, it is considered that the ADPCM signal is shifted by one bit position and then processed in the form of a sample. More specifically, it is considered that the original second bit, the original third bit, the original LSB and the original MSB are regarded as MSB, the second bit, the third bit and LSB, respectively, and then processed. In this case, as mentioned above, there is the high probability that the MSB or the original second bit takes "0", and the second bit often reverses between "1" and "0". Consequently, there is the high probability that the input signal or encoded difference signal of the decoder and the quantizing difference signal take "a fair extent of positive value". Therefore, it often happens that the ADPCM regenerative signal, which is obtained by adding the prediction signal to such a "fair extent of positive value" of signal, also takes a "value larger than the prediction signal".

(B-2) In a Case Where the Original LSB Is Regarded as MSB

Next, it is assumed that the ADPCM signal is shifted by one bit in the other direction as case B-1 and then processed in the form of sample. More specifically, it is considered that the original LSB, the original MSB, the original second bit, and the original third bit are regarded as MSB, the second bit, the third bit and LSB, respectively, and then processed. In this case, there is the high probability that the MSB or the original LSB very often reverses between "1" and "0", and there is the high probability that the second bit or the original MSB also reverses between "1" and "0". Consequently, there is the high probability that the input signal or encoded difference signal of the decoder and the quantizing difference signal are regarded as a "very large value". Further there is the high probability that the ADPCM regenerative signal is also regarded as a "very large value".

(B-3) In a Case Where the Original Third Bit Is Regarded as MSB

Lastly, a shift of two bit positions is considered so that the original third bit, the original LSB, the original MSB and the original second bit are regarded as the MSB, the second bit, the third bit and the LSB, respectively, and then processed. In this case, there is the high probability that the MSB or the original third bit reverses between "1" and "0", and the second bit or the original LSB very often reverses between "1" and "0". Consequently, there is the high probability that the input signal or encoded difference signal of the decoder and the quantizing difference signal are regarded as a "very large value". Further there is the high probability that the ADPCM regenerative signal is also regarded as a "very large value".

As described above, in a case where the ADPCM signal or received signal to the ADPCM decoder is shifted from the synchronization position, it is so interpreted that signals, which appear with the very low probability in the signals to be usually received, are received. Therefore, it is possible to discriminate the synchronization or the asynchronization by means of grasping whether or not a format of the received signal has such probabilities as would correspond to statistical characteristics of ADPCM signals. In view of this point, the present illustrative embodiment is intended to establish the synchronization.

(C) Structure and Operation of the Illustrative Embodiment

Next, the structure and operation of the illustrative embodiment will be explained in detail referring to FIG. 1. As mentioned above, the present illustrative embodiment is adapted to establish synchronization based on the fact that the ADPCM signal or sample received in an asynchronous state is a signal having a format which appears rarely. As a result, there is no need to provide a bit for synchronization, such as a frame pattern bit, in the ADPCM signal. Further, according to the present illustrative embodiment, it is unnecessary to transmit the synchronous input signal from an encoder to a decoder, and it is sufficient that only the ADPCM signal is transmitted from the encoder to the decoder.

In FIG. 1, the ADPCM signal received at the rate of 32 k bit/s is applied to an ADPCM decoder 20. In addition, an 8 kHz clock signal or synchronous input signal, which is generated by a clock signal generator, not illustrated, within a digital transmission apparatus at the receiving end, is also applied through a variable delay circuit 21 having a variable shift register circuit structure to the ADPCM decoder 20. Variable delay circuit 21 is able to vary an amount of delay in units of one-bit periods of the ADPCM signal.

The ADPCM decoder 20 may be provided with the detailed structure as shown in FIG. 2B mentioned above, and serves to divide the ADPCM signal into samples in response to the entered clock signal and then to perform the decoding processing, so as to obtain a 64 k bit/s A-law PCM signal or μ-law PCM signal, and outputs the thus obtained signal to the next stage.

Synchronization of the ADPCM signal and the clock signal applied to the ADPCM decoder 20, that is, a proper division of the ADPCM signal on a sample basis, is performed as follows. At the time of operation of the synchronization establishment, a monitor circuit 22 monitors a quantizing step size, adaptively variable, of an adaptive dequantizer, e.g. circuit 10 in FIG. 2B, and supplies a detection signal to a synchronization detector circuit 23 when the quantizing step size takes a maximum value. The synchronization detector circuit 23 counts the number of maximum value detection signals within a predetermined period of time and compare the count with a predetermined threshold. The detector 23 supplies a phase control circuit 24 with an asynchronous state signal when the count is larger than the threshold, and a synchronous state signal when smaller than the threshold. The phase control circuit 24 is operative in such a manner that upon receiving the asynchronous state signal, an amount of delay of the variable delay circuit 21 is increased by ¼ period of the clock signal, that is, one-bit period of the ADPCM signal. Conversely, upon receiving the synchronous state signal, the delay amount of the variable delay circuit 21 is fixed to the amount of delay at that time.

Figure 5:
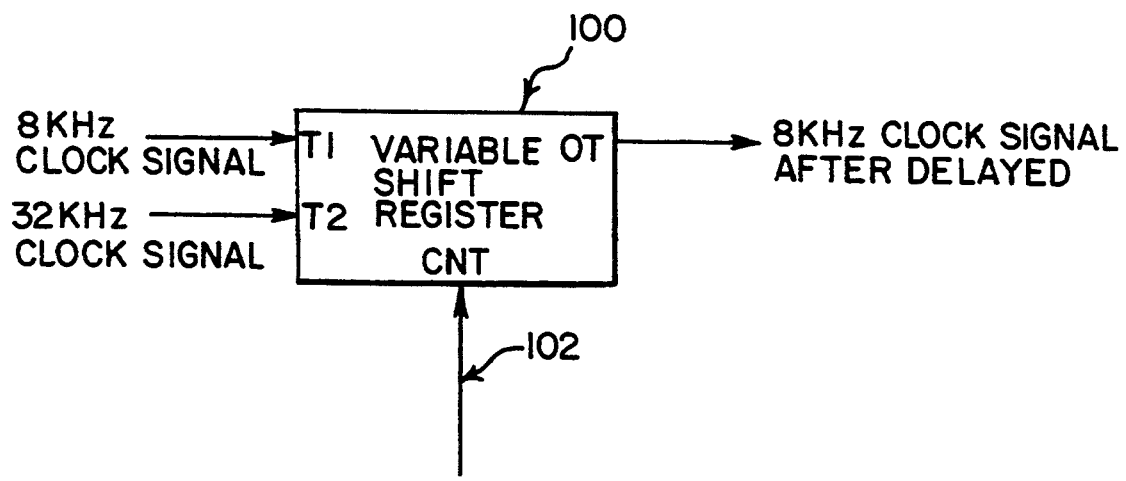
FIG. 5 shows a variable delay circuit as used in FIG. 1.

FIG. 5 shows a constitution of the variable delay circuit 21 of FIG. 1. The variable delay circuit 21 comprises a variable shift register circuit 100. The variable shift register circuit 100 has a variable shift input terminal T1 to which an 8 KHz clock signal is applied, and a variable shift clock terminal T2 to which a 32 KHz clock signal is applied. The variable shift register 100 is also connected to the phase control circuit 24 by wire 102 at its shift number control terminal CNT. Circuit 100 outputs a delayed 8 KHz clock signal which is supplied to the ADPCM decoder 20 of FIG. 1.

The phase control circuit 24 of FIG. 1 is so constructed that it generates no phase control pulse when the system is in its synchronous state, but only a single phase control pulse when in its asynchronous state.

In the asynchronous state, the phase control circuit 24 outputs a binary output, which output is passed via wire 102 to the shift-number control terminal CNT of the variable shift register circuit 100 in response to one phase control pulse. This causes the variable shift register circuit 100 to increase the number of shift stages by one stage. As a result, the variable shift register circuit 100 outputs from a variable shift output terminal OT a delayed 8 KHz clock signal after shifting by the time corresponding to one clock period of the 32 KHz clock signal. In other words, the delay amount of the delayed 8 KHz clock signal is equivalent to the corresponding cycles of a clock of the 32 KHz clock signal. The phase control circuit internally counts up to its maximum state count "3" and then returns to its minimum state count "0". Thus, the delayed 8 KHz clock signal varies in delay by amounts corresponding to from zero to three clocks of the 32 KHz clock signal.

In the synchronous state, no phase control pulse is generated. Thus, the counting state of the phase control circuit is retained as it is, so that the number of the shift stages of the variable shift register circuit 100 is also maintained. That is, the delay amount of the delayed 8 KHz clock signal is fixed without variation.

As stated above, according to the present illustrative embodiment, the synchronization control is performed in such a manner that the synchronous state and the asynchronous state are monitored on the basis of a rate such that the quantizing step size of the adaptive dequantizer takes the maximum value. Of course, the synchronization establishment is performed at the time when there is out of synchronization as well as the time when an initial pull-in is carried out.

Next, the reason why such a synchronization control can be performed will be explained in detail. As stated in item (B) supra "Relation of Statistic Characteristics and Asynchronous State", in the asynchronous state in any situations, the value which is meant by the sample value of the ADPCM signal, or encoded difference signal, takes a large value such as "a fair extent of positive value" or "a very large value". Consequently, the quantizing step size, which is determined by the magnitude of the difference signal, also often takes a large value in the asynchronous state, and thus there happens a maximum value of quantizing step size at a fair extent of rate more than a rate such that a maximum value of quantizing step size occurs in the synchronous state. Accordingly, it is possible to discriminate the synchronous state and the asynchronous state on the basis of a rate such that the maximum value of quantizing step size occurs.

(D) Advantages of the Present Illustrative Embodiment

According to the present illustrative embodiment, the synchronization is established in such a manner that the ADPCM signal train is transmitted as is. In other words, there is no need to insert a frame pattern other than the signals into the ADPCM signal train. Thus, it is possible to avoid the deterioration of the signals through a transmission, and further possible to avoid the necessity for additional transmission of the frame synchronization signal other than the ADPCM signal.

(E) Other Illustrative Embodiments (E-1) Signal Controlled in Phase for Establishment of the Synchronization As the above-mentioned first embodiment shows, when an asynchronous state is identified, the clock signal to be applied to the ADPCM decoder is controlled (adjusted) in phase. It should be noted, however, that synchronization involves the phase relationship between the ADPCM signal, and the clock signal. Thus, the synchronization process and apparatus may be modified in such a manner that a phase of the clock signal to be applied to the ADPCM decoder is fixed and the ADPCM signal is controlled (adjusted) in phase. In other words, a system may be so arranged that the variable delay circuit is provided on the input line of the ADPCM signal to the ADPCM decoder, and the clock signal generated by the clock generator is applied directly to the ADPCM decoder.

(E-2) Applicable Encoding Scheme

In the above-mentioned first embodiment, the present invention is applied to a synchronization scheme of the ADPCM encoding scheme. It is not to be restricted by this embodiment but applicable to the synchronization scheme of other ADPCM encoding schemes on the condition such that at least some portion of the bits of the encoded digital signal under transmission have the unique statistic characteristics. For instance, the aforementioned SB-ADPCM encoding scheme is applicable. Further, a prediction encoding scheme such as the DPCM encoding scheme is directed to encoding a difference signal between an input signal and a prediction signal, and thus it has the statistic characteristics. Therefore, the present invention is applicable to such a scheme.

For reference, the statistic characteristics of SB-ADPCM signal are described hereinafter. The MSB is a polarity bit in a high frequency band. In this polarity bits there are numerous reversals between "1" and "0". The second bit is only one amplitude bit in a high frequency band. Numerous reversals occur between "1" and "0". The third bit is a polarity bit in a low frequency band. Numerous reversals occur between "1" and "0". The fourth bit is a MSB among the amplitude bits in a low frequency band. There is very high probability that it will be a logic "0". The fifth bit is the second bit among the amplitude bits in a low frequency band. There is a fair probability that it will be a logic "0". The sixth bit is the third bit among the amplitude bits in a low frequency band. The seventh bit is the fourth bit among the amplitude bits in a low frequency band. Finally, the LSB is a LSB among the amplitude bits in a low frequency band. It experiences numerous reversals between "1" and "0".

(E-3) Parameters for Use in Determination of the Synchronization

The above-mentioned first embodiment is adapted to determine on the basis of the quantizing step size whether or not synchronization is established, and it is possible to use other parameters for such a determination. More specifically, other parameters in the decoder are varied in aspect between the asynchronous state and the synchronous state owing to the statistic characteristics of the digital transmission signal, such as ADPCM signal, and thus it is possible to utilize other parameters. In fact, in the case of an encoding scheme, such as the DPCM encoding scheme, without utilizing an adaptive quantizer, it is not possible to utilize the quantizing step size, but another parameter. As available parameters, there may be denoted the prediction coefficient of the adaptive predictor, such as predictor 12, FIG. 2B, and bit information itself of the digital transmission signal, etc. Now, it may be so modified that a determination of the synchronous state is performed using plural parameters in combination, and not a specific parameter alone.

Now, an example of a method in which the prediction coefficient is utilized for establishment of the synchronization will be explained. Concerning the SB-ADPCM signal defined in CCITT Recommendation G. 722, on the experiment, there is the high probability that a certain polar prediction coefficient takes a value near the maximum value (but is not maintained to the maximum value) under condition that synchronization has been established. When a bit discrepancy is of 1–6 bit, there is a low probability that the polar prediction coefficient takes a value near the maximum value. When a bit discrepancy is of 7 bit, there is a high probability that the polar prediction coefficient takes just the maximum value. In view of this point, for instance, there may be provided such a system that a monitor circuit is adapted to monitor whether or not the polar prediction coefficient takes a value near the maximum value and within a range except for the maximum value, a synchronization detection circuit is adapted to count during a predetermined period of time the number of times such that the polar prediction coefficient takes a value which is near the maximum value within a range except the maximum value, and determine whether or not a count in the detection circuit exceeds a predetermined number of times, and a phase control circuit is adapted to vary a relative phase of the SB-ADPCM signal against the clock signal if the count does not reach the predetermined number of times.

Next, an example of a method in which bit information itself of the digital transmission signal is utilized for establishment of the synchronization will be explained. In the ADPCM signal defined in CCITT Recommendation G. 721, as mentioned above, the second bit often takes the logic value "0" and the LSB frequently reverses its logical state. Consequently, these are the conditions when synchronization has been established. On the other hand, in the asynchronous condition, the second bit also reverses its logical state, and there are fewer reversals of the LSB. In view of this point, for instance, there may be provided such a system that a monitor circuit is adapted to monitor the logical reversal of the second bit and the LSB. A synchronization detection circuit is adapted to determine that synchronization exists if two conditions are met: (1) if the number of reversal times of the second bit within a predetermined period of time is smaller than a first predetermined number; and (2) the number of reversal times of the LSB exceeds a second predetermined number. Otherwise, the detection circuit determines that synchronization does not yet exist and a phase control circuit is caused to vary a relative phase of the ADPCM signal against the clock signal (if the asynchronous state is determined).

As mentioned above, according to the present invention, synchronization control occurs (even) when only the digital signals are transmitted from the digital communications apparatus at a transmitter end to one at a receiver end, and in the digital communications apparatus at the receiving end, a determination between synchronization and asynchronization is made on the basis of the statistic characteristics of a train of digital transmission signals. Thus, it is possible to realize a synchronization scheme of a digital transmission system according to which no part of the digital transmission signal need be sacrificed for the synchronization, and in addition there is no need to transmit further signals for the synchronization other than the digital transmission signals.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A synchronization system for use in a digital transmission system in which an encoded digital transmission signal is transferred, wherein at least a portion of the bits of the encoded digital transmission signal have unique statistic characteristics, and wherein the encoded digital transmission signal received by a decoder within a digital receiving apparatus is subjected to a decoding process in units of samples on the basis of a synchronous input signal, comprising:

a digital transmitting apparatus for transmitting only the encoded digital transmission signal quantized with the use of an adaptive quantizer; and wherein said digital receiving apparatus includes:
monitor means for monitoring a quantizing step size of an adaptive dequantizer for dequantizing said encoded digital transmission signal, said adaptive dequantizer being included in said decoder that receives the encoded digital transmission signal,
synchronization detection means for determining whether the digital transmission system is in the synchronous state based on an output of said monitor means; and
phase shift means for shifting a relative phase between the encoded digital transmission signal and said synchronous input signal, said shifting occurring in one or more bits of the encoded digital transmission signal in units of samples, when said synchronization detection means determines that the digital transmission system is not in the synchronous state.

2. The synchronization system according to claim 1, wherein said monitor means supplies a detection signal to said synchronization detection means when the quantizing step size takes a maximum value.

3. The synchronization system according to claim 2, wherein said phase shift means includes a variable delay circuit having a variable shift register circuit, and a phase control circuit for controlling an amount of delay of the synchronous input signal by said variable shift register circuit in accordance with the determination result of said synchronization detection means.

4. The synchronization system according to claim 3, wherein said synchronization detecting means serves to count the number of maximum value detection signals within a predetermined period of time, compares a count contained in said synchronization detecting means with a predetermined threshold, supply an asynchronous state signal to said phase control circuit when the count is larger than the threshold, and supply a synchronous state signal to the phase control circuit when the count is less than the threshold.

5. The synchronization system according to claim 4, wherein said phase control circuit is operative in such a manner that, upon receipt of the asynchronous state signal, an amount of delay of the variable delay circuit is increased by one-bit period of the digital transmission signal, and upon receipt of the synchronous state signal, an amount of delay of the variable delay circuit is fixed to the amount of delay at that time.

6. The synchronization system according to claim 1, wherein said encoded digital transmission signal is an adaptive differential PCM signal.

7. The synchronization system according to claim 1, wherein said synchronous input signal is a clock signal.

8. A synchronization system for use in a digital transmission system in which an encoded digital transmission signal is transferred, at least a portion of the bits of the encoded digital transmission signal having unique statistic characteristics, wherein said encoded digital transmission signal received by a decoder within a digital receiving apparatus is subjected to a decoding process in units of samples on the basis of a synchronous input signal, comprising:
a digital transmission apparatus for transmitting only the encoded digital transmission signal quantized with the use of an adaptive predictor; and
wherein said digital receiving apparatus includes:
monitor means for monitoring a prediction coefficient of an adaptive predictor, said adaptive predictor being included in said decoder for performing a decoding process for the encoded digital transmission signal,
synchronization detection means for determining whether the digital transmission system is in the synchronous state based on an output of said monitor means; and
phase shift means for shifting a relative phase between the encoded digital transmission signal and said synchronous input signal supplied to said decoder, said phase shifting occurring by one or more bits of the encoded digital transmission signal in units of samples, when said synchronization detection means determines that the digital transmission system is not in the synchronous state.

9. The synchronization system according to claim 8, wherein said encoded digital transmission signal is an adaptive differential PCM signal.

10. The synchronization system according to claim 8, wherein said synchronous input signal is a clock signal.

* * * * *